United States Patent
Chapman et al.

(10) Patent No.: US 6,186,632 B1
(45) Date of Patent: Feb. 13, 2001

(54) CONDENSER FOR RING-FIELD DEEP-ULTRAVIOLET AND EXTREME-ULTRAVIOLET LITHOGRAPHY

(75) Inventors: Henry N. Chapman, Livermore, CA (US); Keith A. Nugent, North Fitzroy (AU)

(73) Assignee: The Regents of the University of California, Oakland, CA (US)

( * ) Notice: Under 35 U.S.C. 154(b), the term of this patent shall be extended for 0 days.

(21) Appl. No.: 09/224,934

(22) Filed: Dec. 31, 1998

(51) Int. Cl.⁷ .......................................... G02B 5/08
(52) U.S. Cl. .............................. 359/857; 359/852; 355/67
(58) Field of Search .................................. 359/364, 365, 359/366, 726, 727, 852, 853, 857; 355/67

(56) References Cited

U.S. PATENT DOCUMENTS

| | | | |
|---|---|---|---|
| 4,521,087 | * 6/1985 | Hayes et al. | 359/503 |
| 5,339,346 | 8/1994 | White | 378/34 |
| 5,361,292 | 11/1994 | Sweatt | 378/34 |
| 5,512,759 | * 4/1996 | Sweatt | 250/492.1 |
| 5,669,708 | * 9/1997 | Mashima et al. | 362/341 |
| 5,677,939 | 10/1997 | Oshino | 378/34 |
| 5,737,137 | * 4/1998 | Cohen et al. | 359/859 |
| 6,031,598 | * 2/2000 | Tichenor et al. | 355/67 |

OTHER PUBLICATIONS

Tsuneyuki Haga and Hiroo Kinoshita, "Illumination System for Extreme Ultraviolet Lithography" J. Vac. Sci. Techno. B 13(6), Nov./Dec. 1995, pp. 2914–2916.

* cited by examiner

*Primary Examiner*—Cassandra Spyrou
*Assistant Examiner*—Mark A. Robinson
(74) *Attorney, Agent, or Firm*—Daryl S. Grzybicki; Alan H. Thompson

(57) ABSTRACT

A condenser for use with a ring-field deep ultraviolet or extreme ultraviolet lithography system. A condenser includes a ripple-plate mirror which is illuminated by a collimated beam at grazing incidence. The ripple plate comprises a plate mirror into which is formed a series of channels along an axis of the mirror to produce a series of concave surfaces in an undulating pattern. Light incident along the channels of the mirror is reflected onto a series of cones. The distribution of slopes on the ripple plate leads to a distribution of angles of reflection of the incident beam. This distribution has the form of an arc, with the extremes of the arc given by the greatest slope in the ripple plate. An imaging mirror focuses this distribution to a ring-field arc at the mask plane.

24 Claims, 9 Drawing Sheets

CONDENSER FOR RING-FIELD DEEP-ULTRAVIOLET AND EXTREME-ULTRAVIOLET LITHOGRAPHY

The United States Government has rights in this invention pursuant to Contract No. W-7405-ENG-48 between the U.S. Department of Energy and the University of California, for the operation of Lawrence Livermore National Laboratory.

FIELD OF THE INVENTION

The present invention relates generally to lithography systems for semiconductor fabrication, and more specifically to condenser systems for ring-field deep ultraviolet and extreme ultraviolet projection optics.

BACKGROUND OF THE INVENTION

Photolithography has become a critical enabling technology in the fabrication of modern integrated circuit (IC) devices. The photolithography process typically involves exposing a patterned mask to radiation to produce patterned radiation. The patterned radiation is then passed through an optical reduction system, and the reduced patterned radiation or mask image is projected onto a substrate, typically a silicon wafer, that is coated with photoresist. The radiation exposure changes the properties of the photoresist and allows subsequent processing of the substrate.

Photolithography machines or steppers, use two common methods of projecting a mask image onto a substrate, "step and repeat" and "step and scan". The step and repeat method sequentially exposes portions of a substrate to a mask image and uses a projection field which is large enough to project the entire mask image onto the substrate. After each image exposure, the substrate is repositioned and the process is repeated.

Step and scan optical systems typically utilize ring fields to project the mask image onto the substrate, and are more commonly used in IC fabrication processes. The step and scan method scans a mask image onto a substrate through a narrow arc-shaped slit of light. Referring to FIG. 1, a ring-field lithography system 100 for use in the step and scan method is shown. A moving mask 101 is illuminated by a radiation beam 103, which reflects from the mask 101 and is directed through a reduction ring-field optical system 107. Within the optical system 107 the image is reversed and an arc shaped reduced image beam 109 is projected onto a moving substrate 111. The arc-shaped reduced image beam 109 can only project a portion of the mask 101 at one time, and is thus moved over time to scan the complete mask 101 onto the substrate 111. The mask 101 and substrate 111 are moved synchronously in relation to one another to perform the scanning process.

FIG. 2 is a more detailed illustration of the arcuate ring field slit 201 produced by the photolithography system illustrated in FIG. 1. Ring field arc 201 corresponds to the projection of the arc-shaped reduced image beam 109 in FIG. 1, as it is seen on the surface of substrate 111. Ring field arc 201 is projected over angle 209 and is geometrically described by a ring field radius 203, a ring field width 205, and a ring field length 207. In general, ring field coverage is unlimited in azimuth.

As the degree of circuit integration has increased, the feature sizes of IC's have dramatically decreased. To support future semiconductor fabrication requirements, lithography systems using extremely short wavelength radiation have been developed to overcome the inherent limitations of traditional optical systems. Extreme Ultraviolet (EUV) lithography using 10 to 14 nm soft x-ray photons has emerged as a promising technology for fabrication of integrated circuits with design rules requiring sizes of 100 nm or less. Deep Ultraviolet (DUV) lithography using 100–300 nm radiation has also proven to be a viable technology for IC fabrication lithography systems.

In lithography, where it is crucial that the image characteristics are invariant across the imaging field, the condenser optical system is a critical component. Because refractive optics absorb all EUV radiation, only reflective optical elements are suitable for EUV optical systems. In EUV lithography, therefore, the condenser is likely to be all-reflective and must gather as much light as possible from the source, in order to reduce exposure time to an economical level.

Most projection optics image over ring fields, whereas most EUV sources are small and circular. In order to make the most efficient use of the EUV source, a ring-field system requires a condenser that illuminates only the required arc of the ring field. The angular distribution of the illumination at any field point must have a particular profile (for example, a uniform circular disc) and must be directed into the center of the entrance pupil of the projection optical system.

The illumination system for a ring-field projection camera must satisfy a number of criteria. These criteria are driven by the lithographic requirements of the camera, namely, critical dimension (CD) uniformity and minimal pattern placement error across the field, the ability to image at high contrast, and the ability to print at a high rate. To satisfy these requirements, the condenser used in such an optical system must satisfy minimum performance characteristics, such as, shape and uniformity of the pupil fill; lack of any variation of illumination characteristics across the field (stationarity); telecentricity; EUV throughput; and compensation of camera errors. Of these, the pupil fill and stationarity are most important, since they encompass the main purpose of an illuminator which is to provide illumination of the mask in a way that optimizes its aerial image by scanning and minimizes any variation of CD across the field. Furthermore, the EUV throughput must be maximized due to the economic need to minimize exposure times. In addition to these optical metrics, there are also those of the scalability to higher numerical aperture (NA) imaging systems, and the ease of manufacturability of the condenser.

Present, known condenser designs have proven unable to meet all of the requirements demanded by EUV and DUV lithography in which the condenser must collect as much light as possible from a source such as a laser-produced plasma, discharge, or synchrotron source, and transform it into an arc at the mask plane with the desired pupil fill at the pupil plane of the projection optics. Present EUV lithography condensers exhibit certain critical drawbacks, including inefficiency due to the inability to use a large proportion of the EUV light, and non-uniformity of the pupil fill. These drawbacks have led to condensers that are unable to provide both the necessary arc illumination and angular distribution, thus leading to changes in imaging quality across the field and for different object orientation.

SUMMARY AND OBJECTS OF THE INVENTION

It is an object of embodiments of the present invention to provide a condenser for a ring-field optical system that exhibits uniform critical dimension distribution and minimal pattern placement error across the projection field.

It is a further object of embodiments of the invention to provide a condenser that enables the projection optics to generate a high contrast image of the mask pattern.

It is yet a further object of embodiments of the invention to provide a condenser that is readily scalable to imaging systems with different numerical apertures.

A condenser for use with a ring-field deep ultraviolet and extreme ultraviolet lithography system is described. In one embodiment of the present invention, the condenser includes a ripple-plate mirror which is illuminated by a collimated beam at grazing incidence. The ripple plate comprises a plate mirror that includes a series of channels along an axis of the mirror to form a series of concave and/or convex surfaces in an undulating pattern. The light is incident along the channels of the mirror and is reflected onto a series of cones. The distribution of slopes on the ripple plate leads to a distribution angles of reflection of the incident beam. This distribution has the form of an arc, with the extremes of the arc given by the greatest slope in the ripple plate. An imaging mirror focuses this distribution to a ring-field arc at the mask plane.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF THE INVENTION

Embodiments of the present invention are directed toward a photolithography optical system condenser designed for use with ring-field Deep Ultraviolet (DUV) and Extreme Ultraviolet (EUV) imaging. In the following description, for purposes of explanation, numerous specific details are set forth in order to provide a thorough understanding of the present invention. It will be evident, however, to one of ordinary skill in the art, that the present invention may be practiced without these specific details. In other instances, well-known structures and devices are shown in block diagram form to facilitate explanation.

Figure 3:
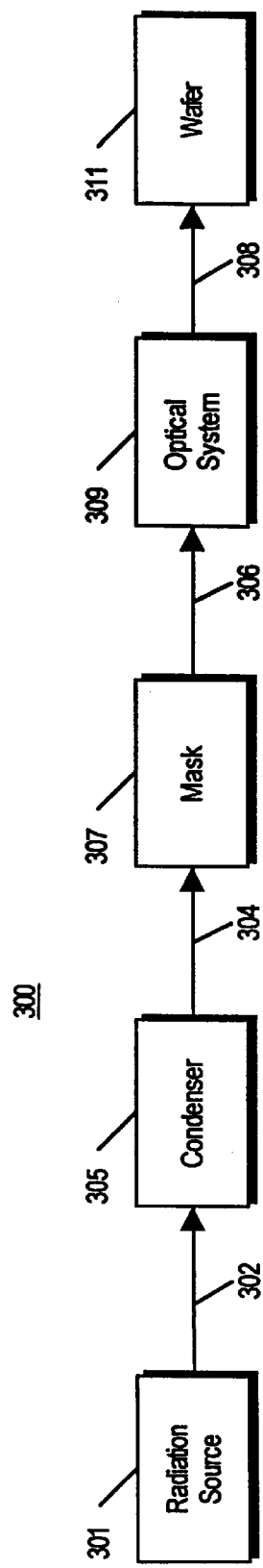
FIG. 3 is a block diagram of a lithography system that implements an embodiment of the present invention.

During DUV or EUV lithography, deep-ultraviolet or extreme-ultraviolet rays are directed at a mask, producing patterned radiation. FIG. 3 is a block diagram of a lithography system for use in semiconductor processing that implements embodiments of the present invention. System 300 comprises a radiation source 301 that emits DUV or EUV radiation 302. The radiation 302 is processed by a condenser 305 that produces a DUV or EUV beam 304 to uniformly illuminate a portion of a mask 307. The radiation reflected or transmitted from the mask 307 produces a patterned beam 306 that is introduced into optical system 309. The optical system 309 outputs image 308 to project a reduced image of mask 307 onto a wafer 311.

For one embodiment of the present invention, radiation source 301 produces EUV radiation. In general, EUV radiation has a wavelength ($\lambda$) between approximately 4 to 30 nm and may be produced by any suitable means including laser produced plasma, synchrotron radiation, electric discharge sources, high-harmonic generation with femto-second laser pulses, discharge-pumped x-ray lasers, and electron-beam driven radiation devices. Embodiments of the present invention are used in EUV lithography systems in which radiation source 301 is implemented as a laser-produced plasma (LPP) source, although it is to be noted that embodiments of the present invention may be used with EUV systems that utilize any other suitable EUV source, such as those listed above. Laser-produced plasma sources focus an intense pulsed laser beam onto a target to produce radiation with a broad emission spectrum. Suitable targets are noble gases and metals, such as gold, tantalum, tungsten, and copper.

The condenser 305 collects EUV power from the LPP source and conditions the radiation to uniformly illuminate the mask 307 and properly fill the entrance pupil of the camera in optical system 309. The condenser provides the EUV radiation in a narrow ring field with certain minimum uniformity characteristics at the mask in the cross scan dimension. The condenser further directs the EUV beam into the entrance pupil of the optical system with certain minimum partial coherence characteristics.

In an alternative embodiment of the present invention, radiation source 301 produces DUV radiation. In general, DUV radiation is defined as radiation with a wavelength in the range of 100 to 300 nm.

Ripple Plate Condenser

In one embodiment of the present invention, the condenser 305 in system 300 includes a ripple plate that reflects collimated light from a source onto many cones. The light is incident along the channels forming the ripple plate so that an incident beam is reflected onto a cone that has its apex at the point of reflection and its axis parallel to the channels. The distribution of slopes on the plate leads to a distribution of angles of reflection. This distribution has the form of an arc, with the extremes of the arc produced by the greatest slope in the ripple plate.

Figure 4:
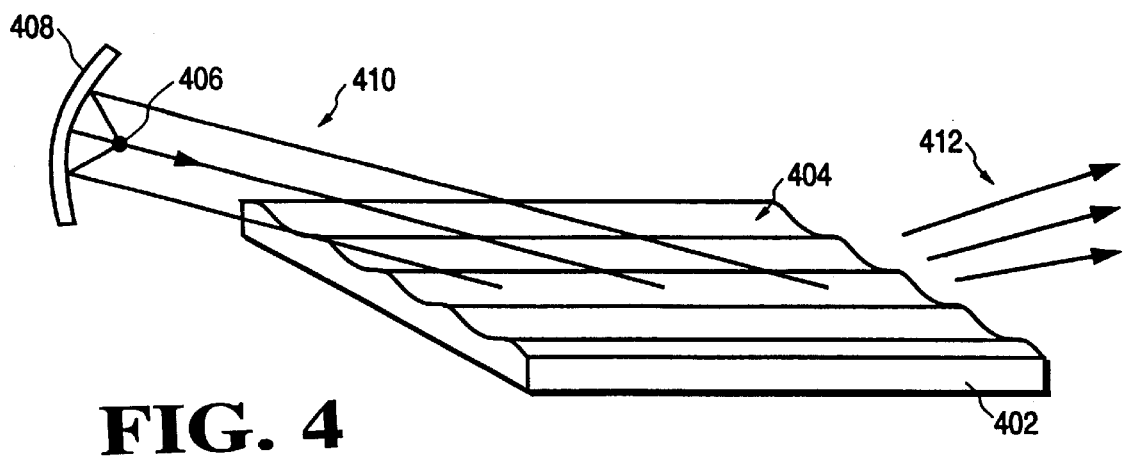
FIG. 4 illustrates a ripple plate mirror that is used in a ring-field EUV lithography condenser, according to one embodiment of the present invention.

In one embodiment of the present invention, the ripple plate used in the condenser comprises a flat mirror with gentle corrugations or grooves (channels) in one direction. FIG. 4 illustrates a ripple plate mirror that is used in the ripple plate condenser, according to one embodiment of the present invention. Mirror 402 is shown with several channels 404 cut into the top surface of the mirror. Light from point source 406 is reflected off of a collector (or collimator) 408 to form incident beams 410 that are oriented such that the component of the rays in the plane of the mirror 402 are parallel to the axis defined by the direction of the channels 404. The incident collimated light is then reflected from ripple plate 402 to produce reflected light 412.

When collimated light illuminates the ripple plate at an angle other than normal incidence it gets redirected onto an arc. The incident light must be aligned along the direction of the channels of the ripple plate mirror; that is, the component of the incident vector in the plane of the ripple plate must be parallel to the channels of the plate mirror.

Figure 5A:
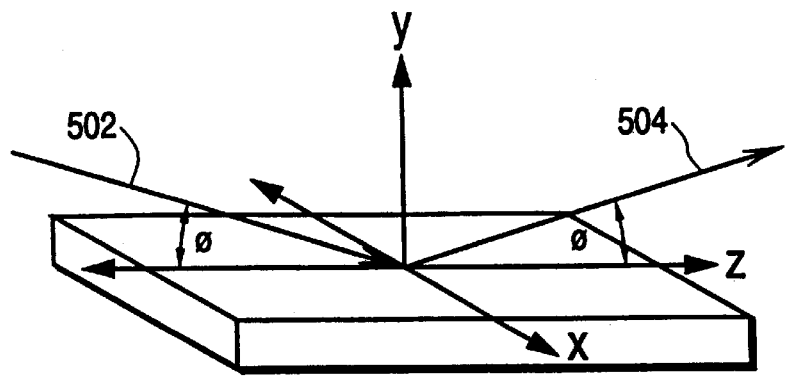
FIG. 5A is a perspective view illustrating the reflection of a grazing incidence light beam from a horizontally oriented plate mirror.
Figure 5B:
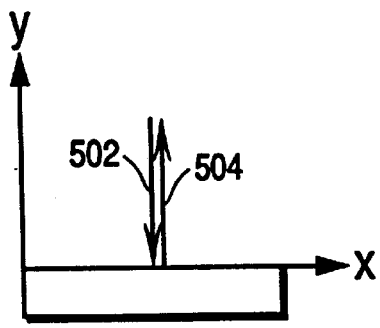
FIG. 5B is a front view of the reflected light ray for the mirror illustrated in FIG. 5A.
Figure 5C:
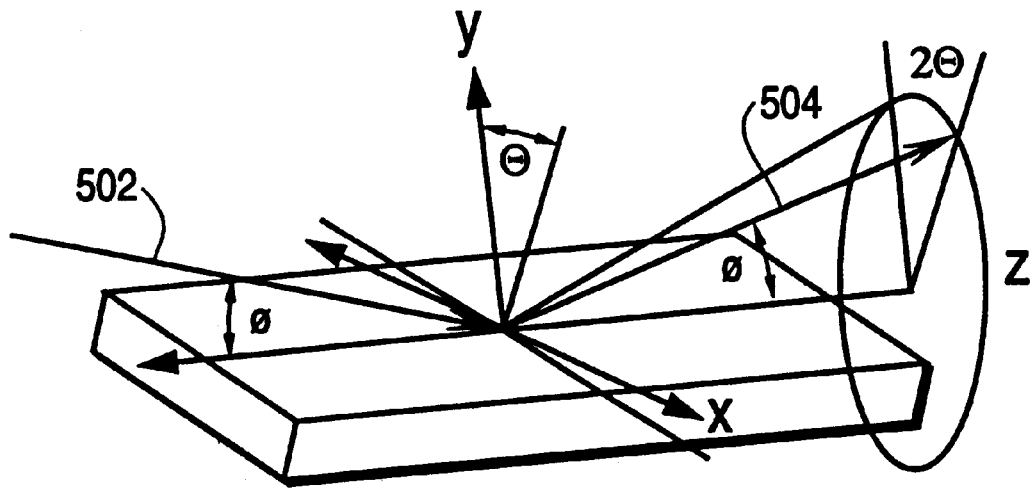
FIG. 5C is a perspective view illustrating the reflection of a grazing incidence light beam from a plate mirror oriented at an angle.
Figure 5D:
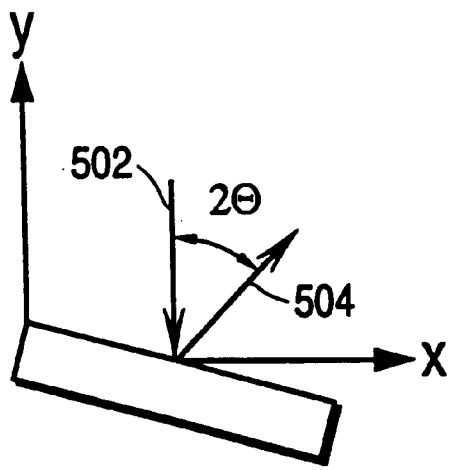
FIG. 5D is a front view of the reflected light ray for the mirror illustrated in FIG. 5C.

The formation of the arc can be explained by considering grazing-incidence reflection from a plane mirror. This is shown in FIG. 5A for a light ray incident at an angle Ø. For purposes of discussion with reference to FIGS. 5A through 5D, it should be noted that the origin is taken as the point of reflection. As shown in FIGS. 5A and 5C, the included angle between the incident ray 502 and the z-axis is Ø. Incident ray 502 is reflected at the same angle to produce reflected ray 504. If, as shown in FIG. 5C, the mirror is rotated by some angle θ about the z-axis, the angle of reflection then changes, but the included angle of the ray and the z-axis remains the same. The angle between the reflected ray and the z-axis is equal to that between the incident ray and the z-axis, i.e., angle Ø. Thus, the reflected ray must lie somewhere on a cone, with an apex half-angle of Ø, and the cone axis corresponding to the z-axis. The position of the reflected ray on the arc can be determined by considering only the x-y components of the rays, as shown in FIGS. 5B and 5D. For example, in FIG. 5D it can be seen that the azimuthal angle of the reflected ray is 2θ. Thus, any stationary mirror in which the slope in the x direction varies across the mirror and remains constant in the z direction, will reflect a pencil-beam of rays onto an arc. If the greatest slopes in the x direction are given by ±tan θ, then the azimuthal angle of the arc will vary between ±2θ.

One example of a mirror which varies in slope in one dimension is a cylindrical mirror. A pencil beam of light incident on a cylindrical mirror along its axis will reflect onto the edge of a cone. However, the apex of the cone is at the point of reflection, and this differs for each point across the surface of the mirror. When the cylindrical mirror is illuminated by a broad collimated beam, the rays will be reflected onto different cones, each one with a different apex position. However, every cone has the same apex angle, so the distribution of angles of reflection will be an arc in θx, θy space. This distribution of angles can be transformed into an actual arc intensity pattern at the back focal plane of a lens since all rays impinging a lens at a particular incidence angle are focused to a common point at the back focal plane of the lens. The same effect is obtained when an imaging mirror is used instead of a lens. The lens or mirror also transforms positions into angles, so the incidence angle a ray makes on the arc depends upon where on the cylindrical mirror reflection took place.

If a single cylindrical mirror, such as that formed from a simple concave surface, is used as a pupil mirror in a condenser (the mirror at which a limiting aperture is placed), any given field point on that arc will receive light only from a very narrow region of the mirror. As described above, the angular range of illumination at a particular field point is given by the positions on the mirror which direct light to that field point. These positions will be located only where the mirror has the right slope to direct light to that field point. In the case of the cylindrical mirror there is only one line at a constant value along an axis that satisfies that condition. Thus, the pupil fill for any given field point on that arc will be limited to a narrow line instead of a solid circular fill. This is a limitation of many existing EUV ring-field condensers.

A quasi-uniform pupil fill can be achieved by forming a repeating cylindrical mirror by joining a series of concave surfaces. For this type of mirror, any one particular slope is distributed across the face of the condenser pupil mirror. In this case, the pupil fill for a particular field point will consist of a single line for each of the repeating cylinder units. At the junction of adjacent concave surfaces (cylinders), however the gradient may be discontinuous. If the junction is a sharp point, high-angle scattering of light incident at the junction may result.

In one embodiment of the present invention, the ripple-plate for use in a condenser for ring-field DUV and EUV lithography, is formed by a smooth and continuous surface that is made by alternating concave and convex mirrors of equal but opposite curvatures. The cross-section of the ripple plate mirror when viewed from the front edge thus resembles a sine wave. Such a ripple plate mirror is illustrated as mirror 402 in FIG. 4. In one embodiment of the present invention, the convex mirror surfaces have the same distribution of slopes as the concave mirror surfaces, and a particular slope occurs at a different position in the convex and concave mirrors. For every period of the undulating ripple-plate mirror, a particular field point will receive light from two lines.

Figure 6:
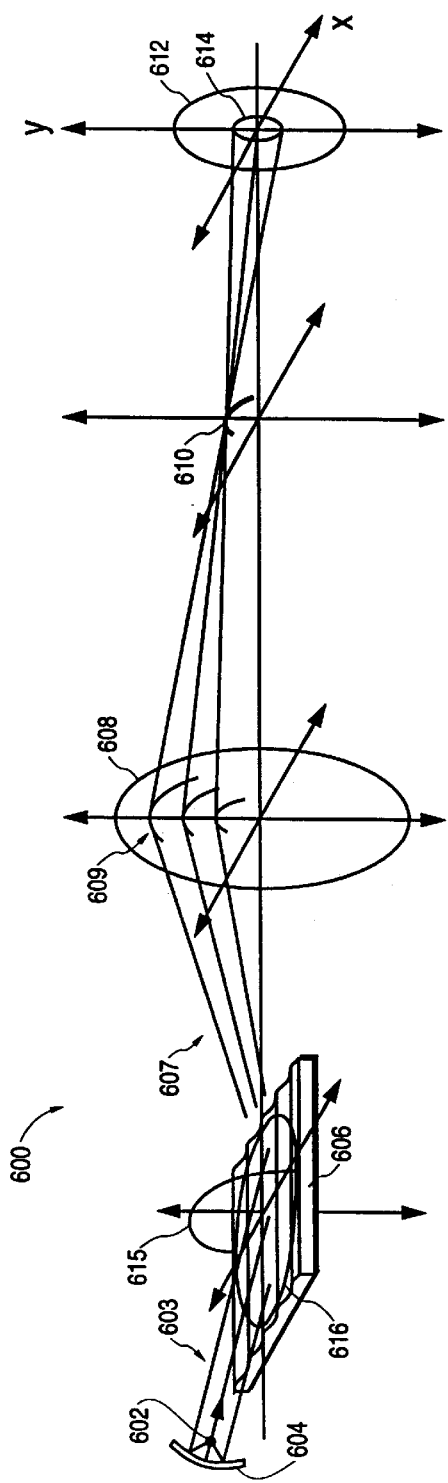
FIG. 6 is a diagram of a condenser system including a straight ripple plate mirror, according to one embodiment of the present invention.

FIG. 6 is a schematic diagram of a condenser utilizing a ripple plate mirror, such as that illustrated in FIG. 4, according to one embodiment of the present invention. EUV radiation from source 602 is collected by collector 604. The collector 604 forms a broad collimated beam of light 603 that strikes the ripple plate mirror 606 to produce reflected rays 607. The ripple plate mirror constitutes the pupil mirror for condenser system 600. The actual limiting aperture which forms the pupil may be a semicircular oriented aperture 615 in the transverse plane, or an elliptical oriented aperture 616 in the plane of the ripple plate. Other shapes of apertures may be used to produce pupil fills other than circular. In one embodiment of the present invention, the incident rays 603 are projected at a grazing angle of incidence of approximately 10 degrees to provide appropriate focal lengths for the condenser.

Each ray of the reflected rays 607 is reflected onto the edge of a cone whose apex is at the point of reflection. Arc 609 represents one of a series of arcs that are formed by the reflected rays 607. The various arcs thus formed are then focused into a single arc by a re-imaging mirror 608, which is illustrated schematically in FIG. 6 as a lens. Arc 610 represents the arcuate ring-field image projected onto the ring-field illumination plane by re-imaging mirror 608. The re-imaging mirror also images the ripple plate mirror (the condenser pupil) onto the entrance pupil 612 of the projection optics. Thus, in condenser 600, the ripple plate mirror 606, which constitutes the pupil of the condenser, is re-imaged into the entrance pupil 612 of the projection optics by the re-imaging mirror 608.

In general, the contrast of the image at a particular field position depends on the angular distribution of the illumination at that field point. For bright-field imaging the illumination must be directed into the entrance pupil 612 of the camera. The distribution of the illumination at the camera pupil, for a given field point, is known as the pupil fill of the condenser. In order to achieve isotropic imaging, i.e., image independent of pattern orientation, the pupil fill should be symmetric and centered in the camera pupil. For binary amplitude objects, the contrast of images is usually optimized if the pupil fill is a disc smaller than the pupil itself, as illustrated in FIG. 6, in which the illumination disc 614 is illustrated as fitting within pupil 612.

The ratio of the radii of the illumination disc to the pupil is called the partial coherence or σ, of the illumination. In terms of the angular distribution of the illumination at the image plane, the partial coherence is defined as:

$$\sigma = \frac{\text{exit NA of condenser}}{\text{entrance NA of camera}}$$

Coherent illumination is defined as σ=0 and completely incoherent illumination is given by α=∞. In one embodiment of the present invention, σ can be adjusted between about 0.3 to 0.8, depending on the dominant frequency of the pattern.

Figure 7:
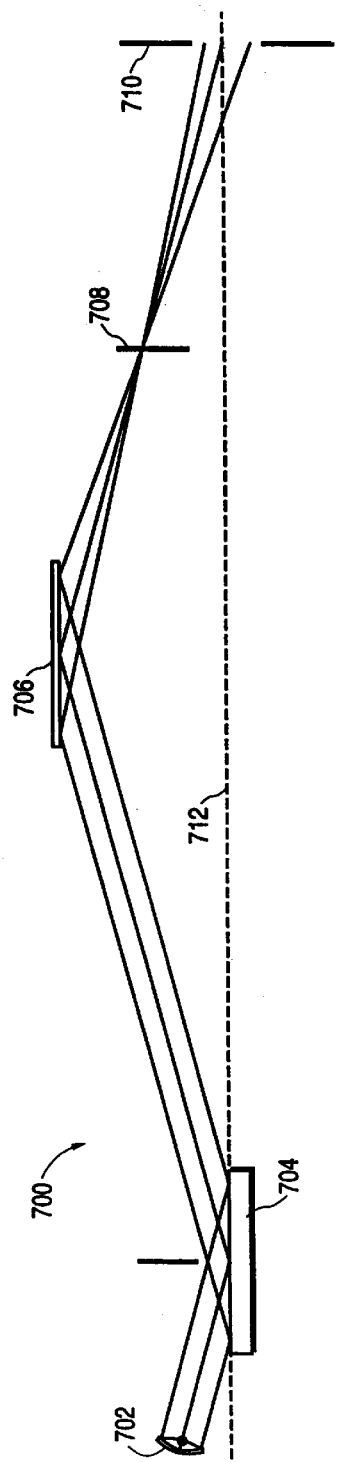
FIG. 7 is a diagram of a condenser system including a ripple plate mirror and a grazing incidence re-imaging mirror, according to one embodiment of the present invention.

In one embodiment of the present invention, the re-imaging mirror is a near normal sphere. Alternatively, the re-imaging mirror could be a rotationally symmetric grazing-incidence mirror. FIG. 7 illustrates a condenser, such as the condenser system illustrated in FIG. 6, in which the re-imaging mirror is a toroid shaped reflecting mirror. In condenser system 700, EUV radiation is focused by source and collector unit 702 onto ripple plate 704 at a grazing angle of incidence. The incident beam is then reflected at the same angle to toroid mirror 706 and focused to form a ring-field arc on mask plane 708. An image of the ripple plate mirror 704 at the condenser pupil is then imaged onto the entrance pupil 710 of the camera along a path defined by optic axis 712. In an alternative embodiment of the present invention, the re-imaging mirror in FIG. 7 is implemented as a compound parabolic concentrator (CPC). Further details regarding the condenser system of FIG. 7 will be provided in the discussion below.

Figure 8A:
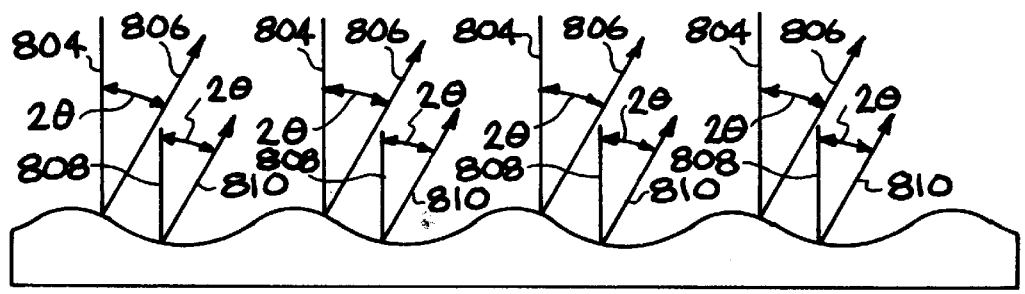
FIG. 8A illustrates the reflection of incident light beams from the ripple plate mirror illustrated in FIG. 6, according to one embodiment of the present invention.
Figure 8B:
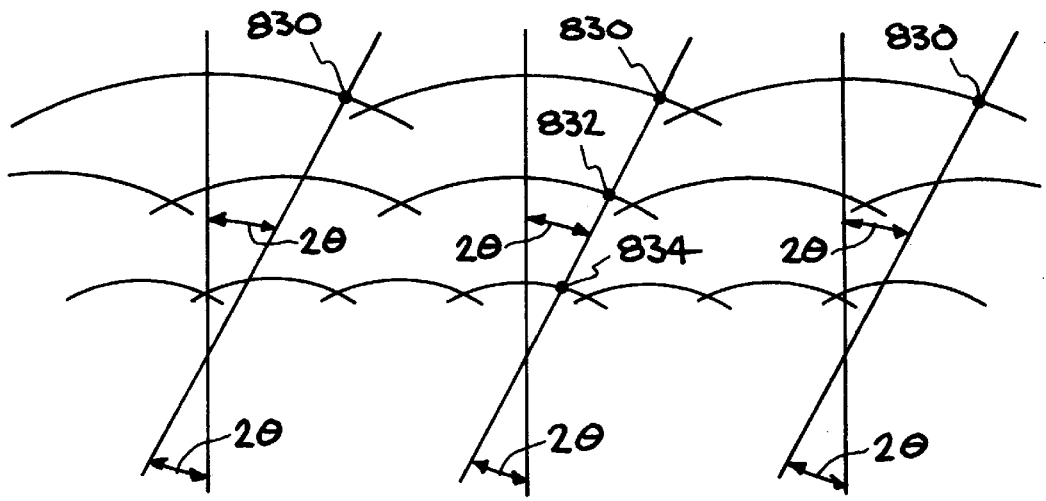
FIG. 8B illustrates the distribution of reflected light on the re-imaging mirror illustrated in FIG. 6, according to one embodiment of the present invention.
Figure 8C:
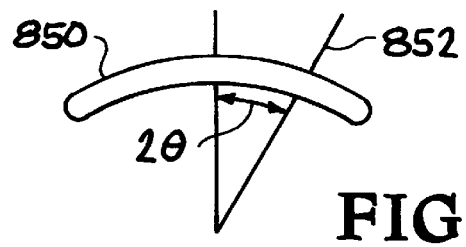
FIG. 8C illustrates the projection of an arc on the ring-field illumination plane illustrated in FIG. 6, according to one embodiment of the present invention.

FIGS. 8A, 8B, and 8C illustrate the formation of a ring-field arc from the collimated light beams in the condenser system 600 of FIG. 6. FIG. 8A illustrates a cross-section of a ripple plate mirror, such as mirror 606 in FIG. 6, as a mirror formed from a smooth series of concave and convex mirror surfaces. Such a cross-sectional view corresponds to an edge-on view of mirror 402 of FIG. 4. FIG. 8A illustrates the reflection of light off of the condenser pupil mirror 606 of FIG. 6. A series of incident beams 804 are shown as being incident to particular points on the convex mirror surfaces of mirror 802. Each of these rays is reflected as a corresponding ray 806. The angle between each of the incident beams 804 and reflected beams 806 is denoted as 2θ. Each of the incident rays 804 is parallel and incident to the same relative point on the corresponding convex surface, thus the reflected rays 806 are parallel, assuming uniform and equal radius mirror surfaces. Likewise, a series of incident beams 808 are shown as being incident to particular points on the concave mirror surfaces of mirror 802. Each of these incident rays is reflected as a corresponding ray 810. The angle between each of the incident beams 804 and reflected beams 806 is also 2θ. Again, each of the incident rays 808 is parallel and incident to the same relative point on the corresponding concave surface, thus the reflected rays 810 are parallel, assuming uniform and equal radius mirror surfaces. As can be seen in FIG. 8A, incident light is reflected at the same angle at two places for each point on a pair of convex-concave surfaces.

As shown in FIG. 6, the reflected rays from the condenser pupil mirror 606 are focused by re-imaging mirror 608. FIG. 8B illustrates the resulting intensity distribution formed on the re-imaging mirror 608. Several rows of repeating series of arcs are formed corresponding to the cone segments created by the incident rays reflected from the points along the ripple-plate mirror 606. FIG. 8B illustrates three points 830, 832, and 834 illuminated by rays reflected at an angle of 2θ on one set of arcs formed on the re-imaging mirror 608. FIG. 8B also illustrates additional points 830 illuminated on different sets of arcs formed on the re-imaging mirror of 608.

Figure 1:
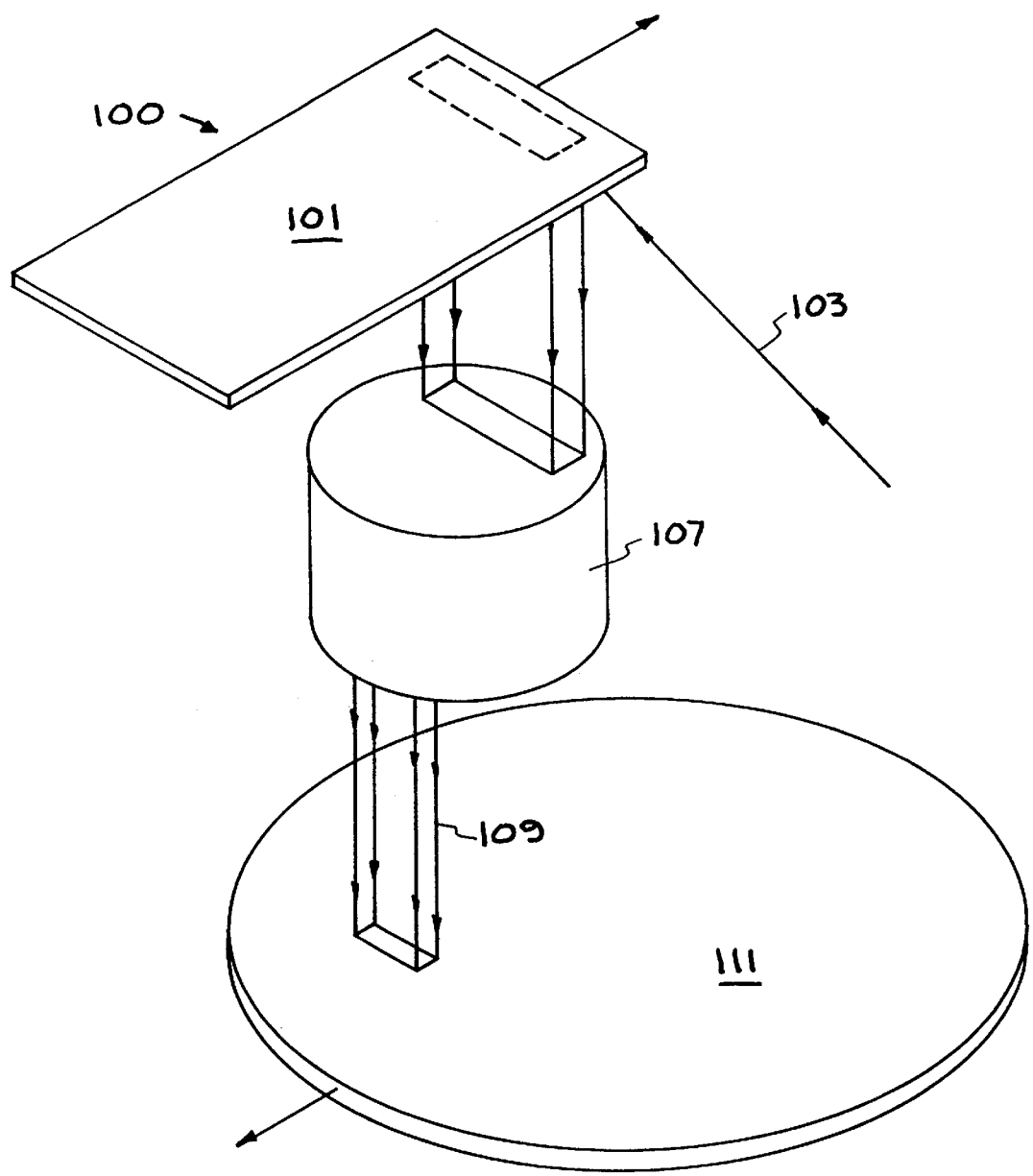
FIG. 1 is a perspective view of a prior art ring-field lithography system.
Figure 2:
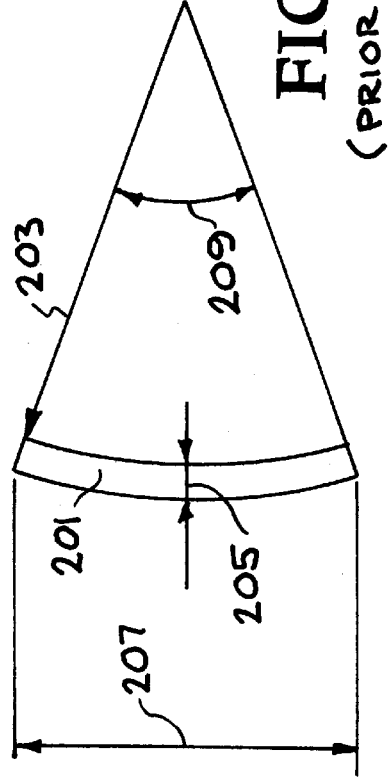
FIG. 2 is a detailed illustration of the arcuate ring-field produced by the ring-field lithography system of FIG. 1.

As shown in FIG. 6, a set of parallel rays incident on the re-imaging mirror are focused to a single point at the back focal plane of the re-imaging mirror. Since all rays that reflect from the ripple plate at a particular angle, 2θ, are parallel, they are focused to a common point. Thus, rays from the re-imaging mirror 608 converge to form a single ring-field arc image 610 on the ring-field illumination plane. FIG. 8C illustrates the ring-field arc image formed on the ring-field illumination plane, according to one embodiment of the present invention. In general, the ring field arc has a general arcuate shape, such as that illustrated in FIG. 2, and represented by arc 850 in FIG. 8C. The points on arc 850 that lie along axis 852 represent all of the points reflected at an angle of 2θ from the ripple plate mirror 606. Thus, the points 830, 832, and 834 in FIG. 8B collapse to a segment along axis 852 on arc 850.

Figure 9A:
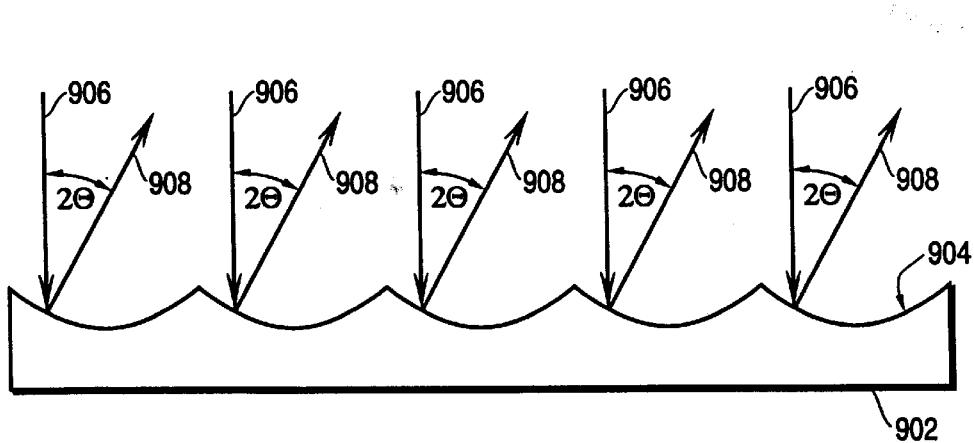
FIG. 9A illustrates a substantially concave ripple plate mirror that is used in a ring-field EUV lithography condenser, according to an alternate embodiment of the present invention.

For the embodiment of the present invention discussed in relation to FIG. 6, the ripple plate mirror 606 was formed from a series of alternating concave-convex surfaces, as illustrated in FIG. 8A. In an alternative embodiment of the present invention, a ripple plate comprising a series of concave surfaces is used as the ripple plate mirror in FIG. 6. FIG. 9A illustrates a ripple plate mirror 902 that is composed of a series of concave surfaces 904. Examples of incident light beams 906 are shown as reflecting off of each of the concave surfaces at an angle 2θ to produce reflected light rays 908.

Figure 9B:
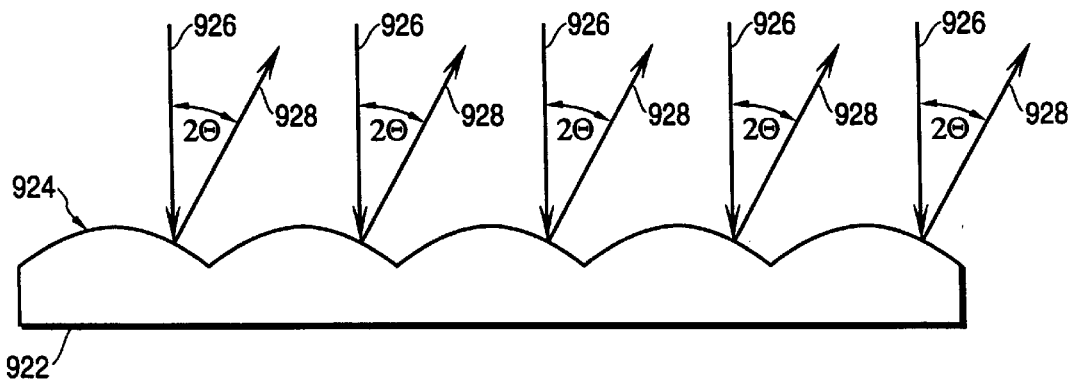
FIG. 9B illustrates a substantially convex ripple plate mirror that is used in a ring-field EUV lithography condenser, according to a further alternate embodiment of the present invention.

In a further alternative embodiment of the present invention, a ripple plate comprising a series of convex surfaces is used as the ripple plate mirror in FIG. 6. FIG. 9B illustrates a ripple plate mirror 922 that is composed of a series of convex surfaces 924. Examples of incident light beams 926 are shown as reflecting off of each of the convex surfaces at an angle 2θ to produce reflected light rays 928.

For each of the ripple plate mirrors illustrated in FIGS. 9A and 9B, a particular field point in the resulting ring-field arc will receive light from one reflected ray for every period in the undulating mirror. This is in contrast to the embodiment of the ripple plate illustrated in FIG. 8A, in which a particular field point receives light from two rays for every period of the mirror.

The ripple plate mirrors illustrated in FIGS. 9A and 9B may also exhibit high-angle scattering of light rays that are incident on the junction between adjacent concave or convex surfaces. The degree of such high-angle scattering is dependent upon the degree of discontinuation or "sharpness" between adjacent surfaces. A sharper junction, such as between two concave surfaces 904 in mirror 902 will result in a higher degree of scattering. This effect can be alleviated to some degree by rounding the junction between the mirror surfaces. However, such rounding or softening may have an effect on the distribution of field points on the ring-field arc, and may negatively impact the uniformity of the pupil fill.

Ripple Plate Functionality

Figure 10:
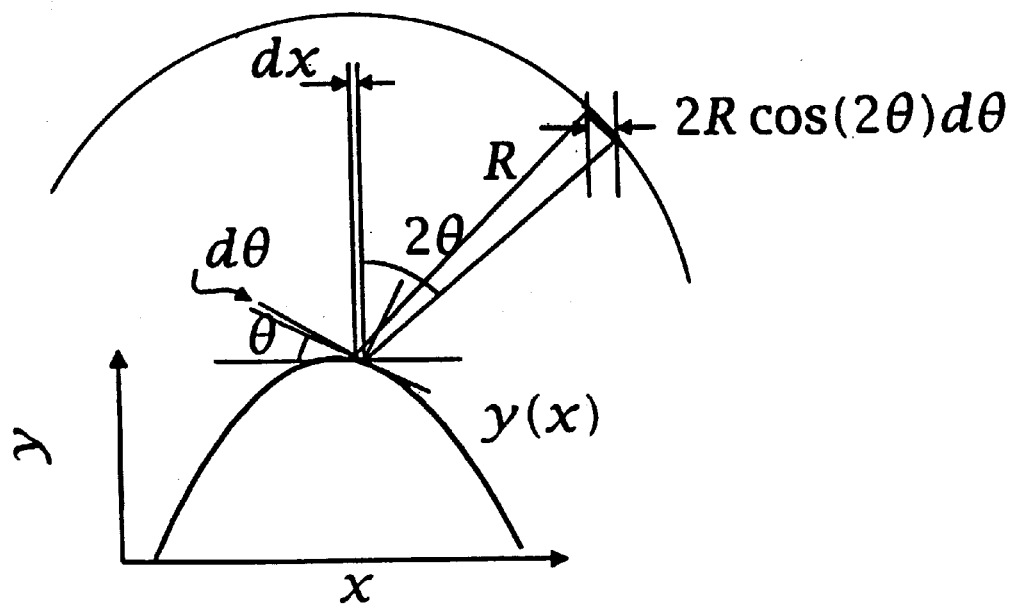
FIG. 10 illustrates collimated light incident along a differential strip of the ripple plate mirror illustrated in FIG. 6, according to one embodiment of the present invention.

In general, a ripple plate mirror that is composed of a smooth series of convex and concave surfaces, such as that illustrated in FIG. 4, will reflect light into an arc, regardless of any variation in the height of the peaks and valleys comprising the convex and concave surfaces of the mirror. However, it should be noted that the profile of the ripple plate does determine the distribution of intensity on the ring-field arc. Since a particular slope on the ripple plate mirror maps to a particular azimuthal point along the arc, the distribution of slopes determines the azimuthal distribution of intensity on the arc. For example, if collimated light is incident along a differential strip dx of the plate, where the gradient in the x direction is given by $dy/dx = \tan\theta$, the range of slopes in that differential strip is then given by $d\theta$, so that the light will be reflected into a differential sector on the arc of angle $2d\theta$, at an azimuthal position of $2\theta$. This is illustrated graphically in FIG. 10. For a scanning ring-field projection camera, it is important that the scan-integrated intensity be constant for all positions on the arc. Given a ring-field radius R, the differential sector on the arc will paint out a scanned strip of light of width $2R\cos(2\theta)\,d\theta$. It is required that each scanned strip be of the same width (and hence yield the same scan integrated intensity), for a given strip width dx on the plate. That is, $$\cos 2\theta \frac{d\theta}{dx} = c$$

In the above equation, c is a constant, and the solution is expressed as:

$$\theta = \frac{1}{2}\arcsin\left(\frac{2x}{c}\right)$$

The actual profile of the plate is then found from $dy/dx = \tan\theta$, which implies that $$y(x) = \int \tan\left(\frac{1}{2}\arcsin 2\frac{x}{c}\right) dx$$
$$= \frac{c}{2}\left\{1 - \sqrt{1 - \frac{4x^2}{c^2}} + \log\left[\frac{1}{2}\left(1 + \sqrt{1 - \frac{4x^2}{c^2}}\right)\right]\right\}$$

In the above equation, $y(0)$ has been arbitrarily set to zero. This function, which is predominantly parabolic, is plotted in FIG. 10, for a negative value of c.

It should be noted that the sign of the constant c can be chosen. That is, either a concave or convex profile of the form given by the above equation will give an arc with constant scan-integrated intensity. In one embodiment of the present invention, the ripple plate mirror is produced by repeating concave and convex surfaces to form a series of channels. The height h (x) of the mirror channels can be expressed by the following equation:

$$h(x) = \begin{cases} y(x - ip) & \text{if } \left(i - \frac{1}{4}\right)p < x < \left(i + \frac{1}{4}\right)p, \\ H - y\left(x - \frac{p}{2} - ip\right) & \text{if } \left(i + \frac{1}{4}\right)p < x < \left(i + \frac{3}{4}\right)p, \end{cases}$$

$$i = 0, \pm 1, \pm 2 \cdots$$

In the above equation, $H = 2y(p/4)$ is the peak-valley amplitude of the ripples. This profile is close to the sinusoidal profile $H/2(1 - \cos(2\pi x/p))$. However, the sinusoid has a greater proportion of steeper slopes to shallower slopes, resulting in an arc that would be more intense at its extremes.

The sector angle of the arc is given by the maximum $2\theta$ angle of reflection, which is itself determined by the maximum slope of h(x), which occurs at $x = p/4$. From the equation that defines the angle $\theta$ above, it is seen that for a given sector half-angle of the arc of $\theta_{arc}$ that is:

$$c = \frac{p}{2\sin\theta_{arc}}$$

Thus, the peak-valley amplitude of the ripples is:

$$H = \frac{p}{2\sin\theta_{arc}}\left\{1 - \cos\theta_{arc} + \log\left[\frac{1}{2}(1 + \cos\theta_{arc})\right]\right\}$$

In the above equation, the ratio of the peak-valley amplitude, H, to the period, p, depends only on the sector angle of the arc. For a 30° arc ($\theta_{arc} = 15°$), the period is 30.9 times the amplitude. For a period of 5 mm, the amplitude is therefore 162 µm.

Pupil Fill Characteristics

In one embodiment of the present invention, the source radiation provided in the lithographic system illustrated in FIG. 6 is a point source. For such a point source, the pupil fill will generally consist of discrete parallel lines aligned vertically in the pupil. Thus, in the system illustrated in FIG. 6, the image at the entrance pupil will comprise a series of vertical lines, each parallel to the y-axis. There will be two lines for each period of the ripple plate, corresponding to the positions on the condenser pupil mirror which have the correct slope to direct light to the particular field point. When an extended source, instead of a point source is used, the lines broaden, since light from different points on the source require slightly different slopes to be directed to a common field point. The broadening of the lines depends on the range of the incident angles on the ripple plate due to the finite source extent. However, for most sources, the source size is unlikely to be large enough so that the lines blur into each other, even though the lines may still blur into each other due to aberrations of the re-imaging lens.

In one embodiment of the present invention, the ripple plate is vibrated in a direction perpendicular to the channels (i.e., in the x direction of FIG. 6). This vibration helps to achieve uniform fill in the entrance pupil. In general, the vibration amplitude need only be as large as the period p, and the time taken to traverse this distance (half the time period of vibration) must be at least the time it takes for a given point on the mask to scan through the ring field. Since the illumination intensity varies along the trajectory of the mask point, greater fill uniformity is achieved if a number of vibration cycles takes place within this scan time. For example, for a production goal of 180 mm/s, the scan time is 33 milliseconds for a ring-field width of a certain size. In this case, the vibration frequency should be about 150 Hz to give 10 half-vibrations. For this embodiment, since the ripple plate is located at the pupil of the condenser, the vibrations have no effect on the illumination intensity at the mask plane.

In one embodiment of the present invention, vibration of the ripple plate mirror is accomplished by a vibrating plate coupled or affixed to the underside of the ripple plate mirror. In an alternative embodiment of the present invention, the ripple plate mirror is vibrated by a motor attached to the ripple plate mirror by an arm or similar arrangement.

Straight Ripple Plate Systems

In one embodiment of the present invention, the ripple plate condenser illustrated in FIG. 4 is used in a photolithography system comprises a single normal-incidence mirror (the collector) and two grazing incidence reflectors (the ripple plate and the re-imaging mirror). FIG. 7 illustrates an embodiment of the invention represented in FIG. 6, in which the re-imaging lens is replaced by a grazing-incidence toroidal mirror.

For the embodiment of FIG. 7, the curvatures of the toroid are set so that the focal lengths for both transverse dimensions are equal. The meridional radius of the toroid is twice the ring-field width, so that parallel rays with x-y components travelling in a particular direction from the ripple plate are focused to a common point on the curved focal surface, corresponding to the ring field. The angle of incidence on the toroid must be the same as that required for the illumination angle at the mask. The sagittal radius of the toroid can be determined using the following equations:

$$f_m = (R_m/2)\sin \varnothing, \quad f_s = R_s/(2\sin \theta)$$

In the above equations, $f_m$ and $f_s$ are the meridional and sagittal focal lengths respectively, $R_m$ and $R_s$ are the meridional and sagittal radii, and $\varnothing$ is the grazing angle of incidence.

In general, the size of the image of the source in the meridional plane at the mask is larger than the geometrical magnification of the condenser, due to aberrations of the toroid. These aberrations also cause a variation in the scan-integrated intensity across the ring-field. In most cases, these aberrations can be significantly improved by using a compound parabolic collector (CPC) instead. In an alternative embodiment of the present invention, the re-imaging mirror in FIG. 6 is replaced with a CPC mirror. Such a CPC can be modeled by placing a parabola tilted by the 10° angle of incidence, and displaced from the optic axis so that its focus lies on the ring-field radius. The surface of revolution is formed by rotating about the optic axis. The curvature of the parabola is adjusted so that the slope of the parabola is zero (parallel to the optic axis) at a point twice the distance from the optic axis than the ring-field. The surface is then a higher-order correction to the toroid.

Tapered Ripple Plate

Figure 11A:
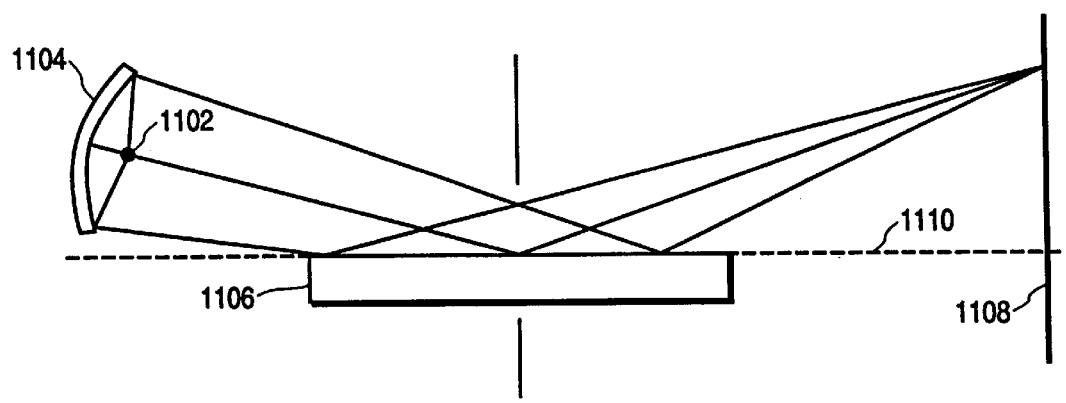
FIG. 11A is a side-view diagram of a condenser system including a tapered ripple plate mirror, according to an alternative embodiment of the present invention.
Figure 11B:
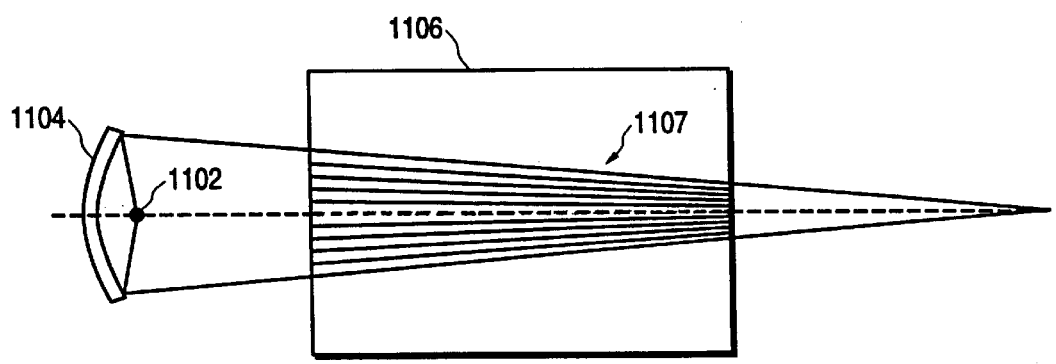
FIG. 11B is a top-view diagram of the condenser system illustrated in FIG. 11A, according to one embodiment of the present invention.

Certain classes of ring-field projection optics designs have a virtual entrance pupil that is located upstream of the object plane. For these designs, the illumination at the mask must diverge away from the optic axis, appearing to originate within an on-axis circular region at a plane prior to the mask. In this case the re-imaging mirror can be eliminated by making the condenser pupil coincident with the camera entrance pupil. The source must still be imaged onto the mask, and this can be achieved by using an ellipsoidal, instead of a paraboloidal, collector. For this system, the light incident on the ripple plate is no longer collimated. Light incident on the central channel of the ripple plate mirror is still parallel to the meridional plane of that particular channel, but this is not the case for light incident on the other channels. Here, the channel will be rotated about the y axis relative to the incoming ray, so the reflected beam will lie on an arc which is rotated about the central field. The illumination at the mask from all channels will then have a bow-tie appearance. This aberration is corrected by tapering the ripple plate mirror, so that off-axis rays still run parallel to the channels. FIGS. 11A and 11B illustrate an alternative embodiment of the present invention in which the ripple plate is tapered instead of straight.

In FIG. 11A, source 1102 and collector 1104 focus incident DUV or EUV radiation to ripple plate 1106. The incident beams are then reflected off of the ripple plate mirror 1106 along the optic axis 1110 to produce an image at the mask plane 1108. For the embodiment illustrated in FIG. 11A, the ripple plate mirror constitutes both the camera entrance pupil and the condenser pupil. In condenser system of FIG. 11A, the ripple plate mirror 1106 comprises a mirror plate in which a series of channels is formed in the direction of the path of the incident beam. The channels are tapered, so that the channels are narrower at the end closer to the mask plane than at the end closer to the collector.

FIG. 11B is a top-view of the condenser system illustrated in FIG. 11A. As shown in FIG. 11B, ripple plate mirror 1106 contains a series of channels 1107 that are not parallel to one another, but are rather tapered at an angle that focuses the incident rays at a point on the mask plane.

Although the above discussion focused primarily on embodiments of a condenser system for use with ring-field EUV lithography, alternative embodiments of the described condenser system can also be used with ring-field DUV lithography, or any ring-field lithography system using radiation in the general range of 10 nm to 300 nm. The condenser system according to these alternate embodiments of the present invention can be suitably modified to accommodate the higher numerical apertures required for DUV sources, or other sources within the 10–300 nm range.

In the foregoing, a condenser for use in ring-field DUV and EUV lithography has been described. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. An apparatus comprising:
    a point source producing radiation;
    a collector positioned at one end of the point source to focus the radiation from the point source into a collimated beam of radiation transmitted along an optic axis of the apparatus;
    a ripple plate mirror oriented longitudinally to the optic axis and positioned to focus the collimated beam into a plurality of arcs, wherein the ripple plate mirror comprises a uniform series of concave and convex surfaces to form a series of channels, and the ripple plate mirror is oriented such that a component of rays, comprising the collimated beam in the plane of the ripple plate mirror, is parallel to the channels; and an imaging mirror positioned to focus the plurality of arcs into a single ring-field arc.

2. The apparatus of claim 1 wherein the channels are parallel and straight relative to an axis of the ripple plate mirror.

3. The apparatus of claim 2 wherein, the imaging mirror comprises a mirror having a near normal spherical surface and positioned such that rays incident from the ripple plate mirror are incident to the imaging mirror at a grazing angle of incidence.

4. The apparatus of claim 2 wherein the imaging mirror comprises a mirror having a toroidal surface and positioned such that rays incident from the ripple plate mirror are incident to the imaging mirror at a grazing angle of incidence.

5. The apparatus of claim 2 wherein the imaging mirror comprises a compound parabolic collector.

6. The apparatus of claim 2 further comprising a vibrating system coupled to the ripple plate mirror to vibrate the ripple plate mirror in a direction perpendicular to an axis defined by the channels.

7. The apparatus of claim 2 wherein the ripple plate mirror constitutes a condenser pupil for a condenser system used in a ring-field projection system.

8. The apparatus of claim 7 wherein the ring-field projection system is used in an Extreme Ultraviolet lithography system.

9. The apparatus of claim 7 wherein the ring-field projection system is used in a Deep Ultraviolet lithography system.

10. An apparatus comprising:
a point source producing radiation;
a collector positioned around an end of the point source to focus the radiation from the point source into a collimated beam of radiation along an optic axis of the apparatus; and
a tapered ripple plate mirror oriented longitudinally to the optic axis and positioned to focus the collimated beam into a plurality of arcs, wherein the tapered ripple plate mirror includes a series of channels oriented at an angle converging at a focal point defined by a longitudinal axis of the tapered ripple plate mirror, and wherein the tapered ripple plate mirror comprises a uniform series of concave and convex surfaces to form the series of channels, and the tapered ripple plate mirror is oriented such that a component of rays, comprising the collimated beam in the plane of the tapered ripple plate mirror, is parallel to a first channel of the series of channels.

11. The apparatus of claim 10 further comprising a mask plane positioned such that an arcuate ring-field image is projected by the tapered ripple plate mirror onto the mask plane.

12. The apparatus of claim 11 wherein the tapered ripple plate mirror constitutes a condenser pupil which coincides with the camera entrance pupil, for a condenser system used in a ring-field projection system.

13. The apparatus of claim 12 wherein the ring-field projection system is used in an Extreme Ultraviolet lithography system.

14. The apparatus of claim 12 wherein the ring-field projection system is used in a Deep Ultraviolet lithography system.

15. A condenser for use in a ring-field projection lithography system, the condenser comprising:
point source means for producing short wavelength ultraviolet radiation;
collector means for focusing the short wavelength ultraviolet radiation from the point source means into a collimated beam of radiation;
first mirror means for focusing the collimated beam into a plurality of arcs, the first mirror means comprising a ripple plate mirror including a series of concave and convex surfaces to form a series of channels oriented longitudinally along an axis of the first mirror means, and wherein the ripple plate mirror is oriented such that a component of rays, comprising the collimated beam in the plane of the ripple plate mirror, is parallel to the channels; and
second mirror means for focusing the plurality of arcs into a single ring-field arc.

16. The condenser of claim 15 wherein the second mirror means comprises a mirror having a toroidal surface and positioned such that rays incident from the first mirror means are incident to the second mirror means at a grazing angle of incidence.

17. The condenser of claim 15 wherein the second mirror means comprises a compound parabolic collector.

18. The condenser of claim 15 further comprising means for vibrating the first mirror means in a direction perpendicular to an axis defined by the collimating beam.

19. The condenser of claim 15 wherein the point source means for producing short wavelength ultraviolet radiation comprises means for producing extreme ultraviolet radiation.

20. The condenser of claim 15 wherein the point source means for producing short wavelength ultraviolet radiation comprises means for producing deep ultraviolet radiation.

21. A method comprising the steps of:
generating a point source of short wavelength ultraviolet radiation;
collimating radiation from the point source to form collimated incident beams;
focusing the collimated incident beams on a first mirror, the first mirror comprising a ripple plate mirror including a series of concave and convex surfaces to form a series of channels oriented longitudinally along an axis;
orienting the ripple plate mirror such that a component of rays, comprising the collimated incident beams in the plane of the ripple plate mirror, is parallel to the channels;
reflecting the collimated incident beams from the first mirror to form reflected beams that project a plurality of cones, portions of the plurality of cones producing a series of arc images when focused onto a second mirror; and
focusing the reflected beams from the second mirror to form a single ring-field arc composed of elements from the series of arc images.

22. The method of claim 21 further comprising the step of vibrating the first mirror in a direction perpendicular to an axis defined by the collimated incident beam.

23. The method of claim 21 further comprising the step of producing extreme ultraviolet radiation from the point source.

24. The method of claim 21 further comprising the step of producing deep ultraviolet radiation from the point source.

* * * * *